(12) United States Patent
Ito

(10) Patent No.: US 8,963,329 B2
(45) Date of Patent: Feb. 24, 2015

(54) SEMICONDUCTOR DEVICE

(71) Applicant: Renesas Electronics Corporation, Kawasaki-shi, Kanagawa (JP)

(72) Inventor: Masahiro Ito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/915,278

(22) Filed: Jun. 11, 2013

(65) Prior Publication Data

US 2013/0328193 A1 Dec. 12, 2013

(30) Foreign Application Priority Data

Jun. 12, 2012 (JP) ................................ 2012-132613

(51) Int. Cl.
H01L 23/498 (2006.01)
G11C 5/00 (2006.01)
H01L 25/065 (2006.01)
H01L 25/18 (2006.01)
H01L 23/12 (2006.01)
H05K 1/02 (2006.01)
H05K 1/00 (2006.01)

(52) U.S. Cl.
CPC ........... *H01L 23/49816* (2013.01); *H01L 23/12* (2013.01); *H05K 1/0213* (2013.01); *H05K 1/02* (2013.01); *H05K 1/00* (2013.01); *H01L 2224/16225* (2013.01); *G11C 5/00* (2013.01); *H01L 23/49838* (2013.01); *H01L 25/0655* (2013.01); *H01L 25/18* (2013.01)
USPC ........... 257/738; 257/734; 257/773; 257/774; 257/777

(58) Field of Classification Search
CPC ............ H01L 23/49816; H01L 23/498; H01L 2924/1434; H01L 23/12; H05K 1/00; H05K 1/0213; H05K 1/02
USPC .......................... 257/734, 738, 773, 774, 777
See application file for complete search history.

(56) References Cited

U.S. PATENT DOCUMENTS

| 7,009,115 | B2 | 3/2006 | Seaman et al. | |
| 2003/0090291 | A1* | 5/2003 | Otsuka | 326/21 |
| 2011/0317372 | A1* | 12/2011 | Nomoto et al. | 361/729 |

* cited by examiner

*Primary Examiner* — Peniel M Gumedzoe
(74) *Attorney, Agent, or Firm* — Foley & Lardner LLP

(57) ABSTRACT

Provided is a semiconductor device capable of increasing the number of signals. A semiconductor device according to an embodiment of the invention includes memories; a controller that designates addresses of the memories; a mounting board having lines formed thereon, the lines connecting the controller with the memories; and a first ball group that connects the controller with the lines of the mounting board. A plurality of address lines formed on the mounting board includes an address line formed of a front surface wiring layer, and an address line formed of a back surface wiring layer. In each of the front surface wiring layer and the back surface wiring layer, each of the address lines from first balls of the first ball group is routed in order from a first memory to a fourth memory.

9 Claims, 11 Drawing Sheets

SEMICONDUCTOR DEVICE

CROSS-REFERENCE TO RELATED APPLICATIONS

This application is based upon and claims the benefit of priority from Japanese patent application No. 2012-132613, filed on Jun. 12, 2012, the disclosure of which is incorporated herein in its entirety by reference.

BACKGROUND

The present invention relates to a semiconductor device, and more particularly, to a semiconductor device including solder balls, for example.

The specification of U.S. Pat. No. 7,009,115 (FIG. 5B) discloses a BGA (Ball Grid Array) type semiconductor device. The BGA type semiconductor device includes solder balls arranged in an array. In the semiconductor device, lines are formed on a mounting board so as to pass through a space between the solder balls. Specifically, the lines are formed in the space between the solder balls in such a manner that a line connected to a certain solder ball is not connected to another solder ball.

Along with the enhanced functionality, speed-up, and miniaturization of semiconductor devices, there is a demand for increasing the number of balls (signal lines) and narrowing a pitch. In the BGA having a narrow pitch, the number of lines passing through the space between balls is reduced. In the specification of U.S. Pat. No. 7,009,115 (FIG. 5B), some of the solder balls are removed to allow lines to pass through the space between the balls. This results in a reduction in the number of balls, that is, the number of signals.

Other problems to be solved and novel features will be apparent from the description of the specification and the accompanying drawings.

SUMMARY

According to a first aspect, a semiconductor device includes a multi-layer wiring board and memories. In the semiconductor device, a plurality of address lines formed on the multi-layer wiring board includes a first address line formed of a first wiring layer, and a second address line formed of a second wiring layer. In each of the first and second wiring layers, each of the first and second address lines from solder balls of a solder ball group is routed in order from a first memory to an n-th memory.

According to the first aspect, it is possible to increase the number of signals.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
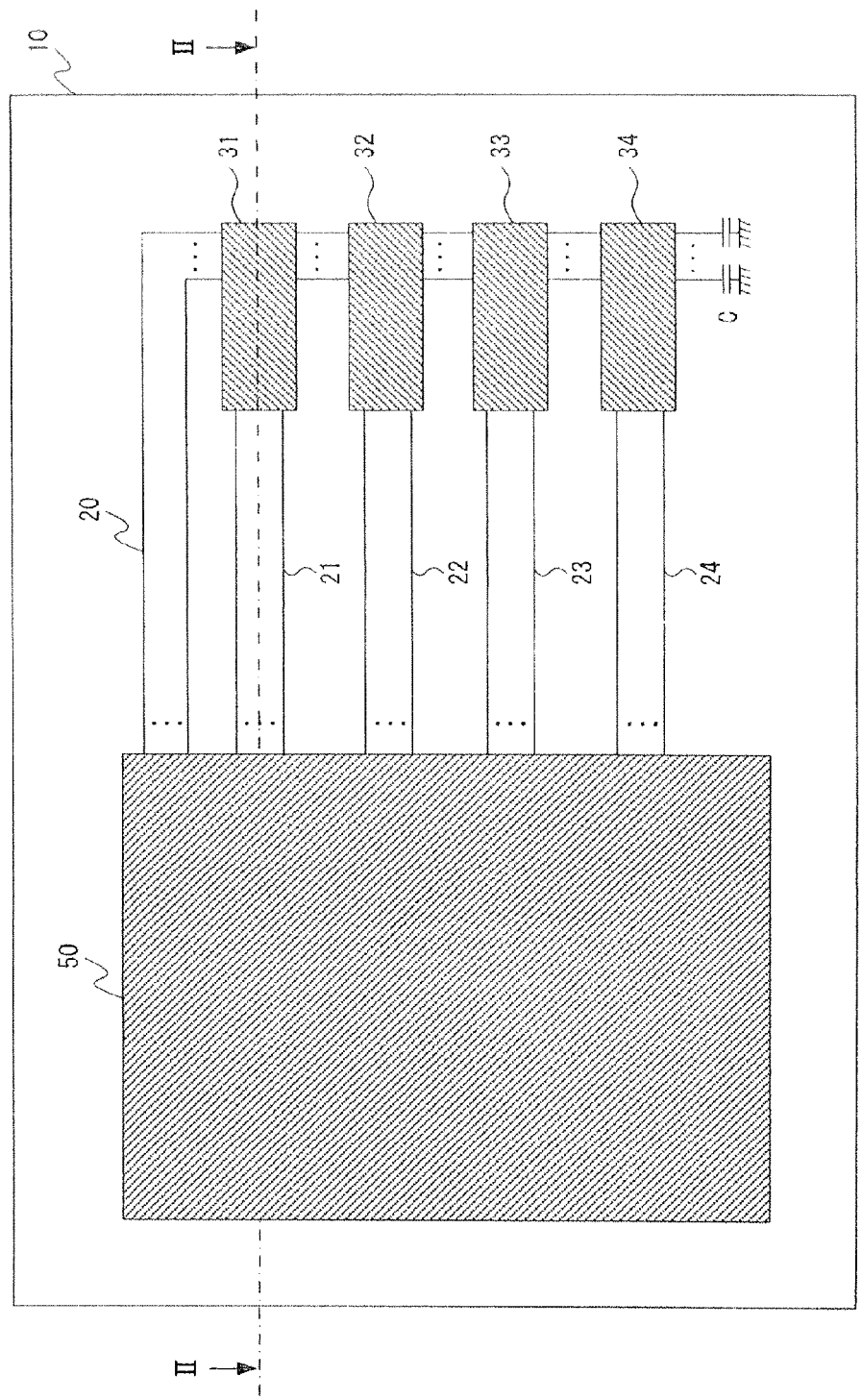
FIG. 1 is a plan view schematically showing an overall configuration of a semiconductor device.
Figure 2:
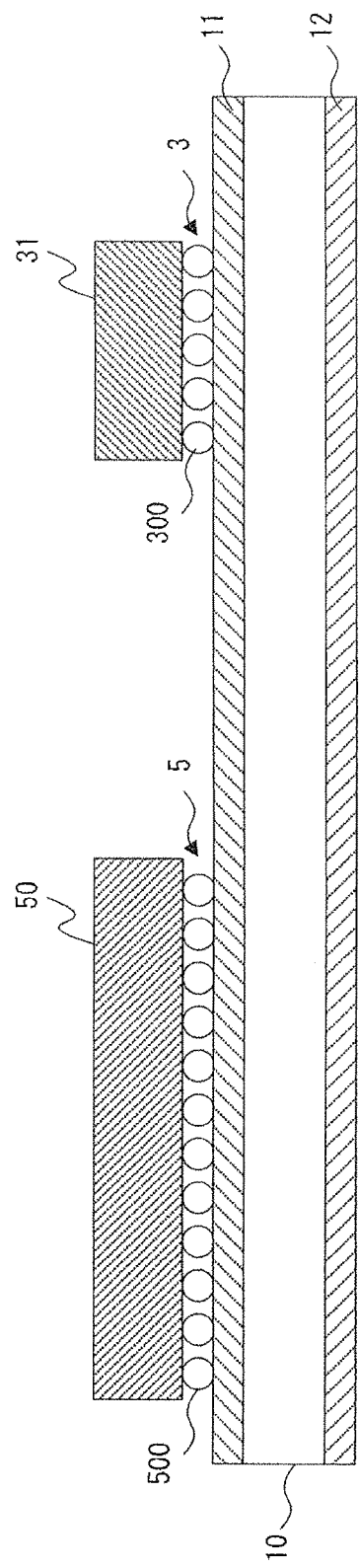
FIG. 2 is a sectional view taken along the line II-II of FIG. 1.

A configuration of a semiconductor device according to a first embodiment will be described with reference to FIGS. 1 and 2. FIG. 1 is a plan view schematically showing the configuration of the semiconductor device. FIG. 2 is a sectional view taken along the line II-II of FIG. 1.

As shown in FIG. 1, the semiconductor device includes a mounting board 10, a first memory 31, a second memory 32, a third memory 33, a fourth memory 34, and a controller 50. For example, each of the first memory 31, the second memory 32, the third memory 33, and the fourth memory 34 is an 8-bit DDR (Double Data Rate) memory. Accordingly, the first memory 31 to the fourth memory 34 form a 32-bit memory as a whole. The controller 50 controls writing and reading data to and from the first memory 31, the second memory 32, the third memory 33, and the fourth memory 34. For example, each of the first memory 31, the second memory 32, the third memory 33, and the fourth memory 34 is a DDR3 memory having a frequency of 800 MHz, 1066 MHz, 1333 MHz, 1600 MHz, 1866 MHz, 2133 MHz, 2400 MHz, or 2666 MHz. In this case, an example of the DDR3 memory having a frequency of 1600 MHz will be described. Note that the DDR3 memory requires fly-by wiring, unlike DDR1 and DDR2 memories. For this reason, this embodiment is suitably used for the DDR3 memory. As a matter of course, this embodiment is not limited to the DDR3 memory.

The controller 50 is a BGA type semiconductor package. As shown in FIG. 2, the controller 50 and the mounting board 10 are connected with a first ball group 5. The first ball group 5 includes a plurality of first balls 500. The first balls 500 of the first ball group 5 are arranged in an array. The first balls 500 of the first ball group 5 are solder balls which are used to mount the controller 50 on the mounting board 10. That is, the controller 50 is mounted on the mounting board 10 through the first balls 500 of the first ball group 5.

Each of the first memory 31 to the fourth memory 34 is a BGA type semiconductor package. Accordingly, as shown in FIG. 2, the first memory 31 and the mounting board 10 are connected with a second ball group 3. The second ball group 3 includes a plurality of second balls 300. The second balls 300 of the second ball group 3 are arranged in an array. The second balls 300 of the second ball group 3 are solder balls which are used to mount the first memory 31 on the mounting board 10. That is, the first memory 31 is mounted on the mounting board 10 through the second balls 300 of the second ball group 3. Also the second memory 32 to the fourth memory 34 have a configuration similar to that of the first memory 31. The first memory 31 to the fourth memory 34 are 8-bit DDR3 memories having the same configuration, and are mounted on the mounting board 10 with the same number of second calls 300.

The mounting board 10 is a multi-layer wiring board including a plurality of wiring layers. For example, the mounting board 10 includes four wiring layers. A front surface wiring layer 11 (first wiring layer) formed on the front surface (a solder surface, i.e., a mounting surface of each solder ball) of the mounting board 10, and a back surface wiring layer 12 (second wiring layer) formed on the opposite surface serve as signal lines (see FIG. 2). The other two wiring layers, i.e., the wiring layers other than the front surface wiring layer 11 and the back surface wiring layer 12 are used as a ground line or a power supply line, so the description thereof is omitted. The mounting board 10 is not limited to the multi-layer wiring board having a four-layer structure. Any mounting board may be used as the mounting board 10, as long as the mounting board includes two or more wiring layers.

Address lines 20 and data lines 21 to 24 are formed on the mounting board 10. The address lines 20 and the data lines 21 to 24 are formed of the front surface wiring layer 11 and the back surface wiring layer 12. The data line 21 is connected to each of the controller 50 and the first memory 31. Specifically, the data line 21 is connected to the controller 50 through the first balls 500 of the first ball group 5. The data line 21 is connected to the first memory 31 through the second balls 300 of the second ball group 3.

Also the data lines 22 to 24 have a configuration similar to that of the data line 21. Specifically, the data lines 22 to 24 are connected to the controller 50 through the first balls 500 of the first ball group 5. The data line 22 is connected to the second memory 32 through the second balls 300 of the second ball group 3. Similarly, the data line 23 is connected to the third memory 33 through the second balls 300 of the second ball group 3, and the data line 24 is connected to the fourth memory 34 through the second balls 300 of the second ball group 3.

Each address line 20 connects the controller 50 to each of the first memory 31 to the fourth memory 34. Specifically, each address line 20 is connected to the controller 50 through the first balls 500 of the first ball group 5. Each address line 20 is connected to each of the first memory 31 to the fourth memory 34 through the second balls 300 of the second ball group 3. Each address line 20 is formed of the front surface wiring layer 11 or the back surface wiring layer 12.

A single address line 20 is connected to each of the first memory 31 to the fourth memory 34. Each address line 20 is a fly-by line. This allows a common address signal to be input to each of the first memory 31 to the fourth memory, thereby designating the same address. Thus, each address line 20 from the controller 50 is routed in order from the first memory 31 to the fourth memory 34. After being routed to the fourth memory, each address line 20 is connected to a ground through a capacitor.

Figure 3:
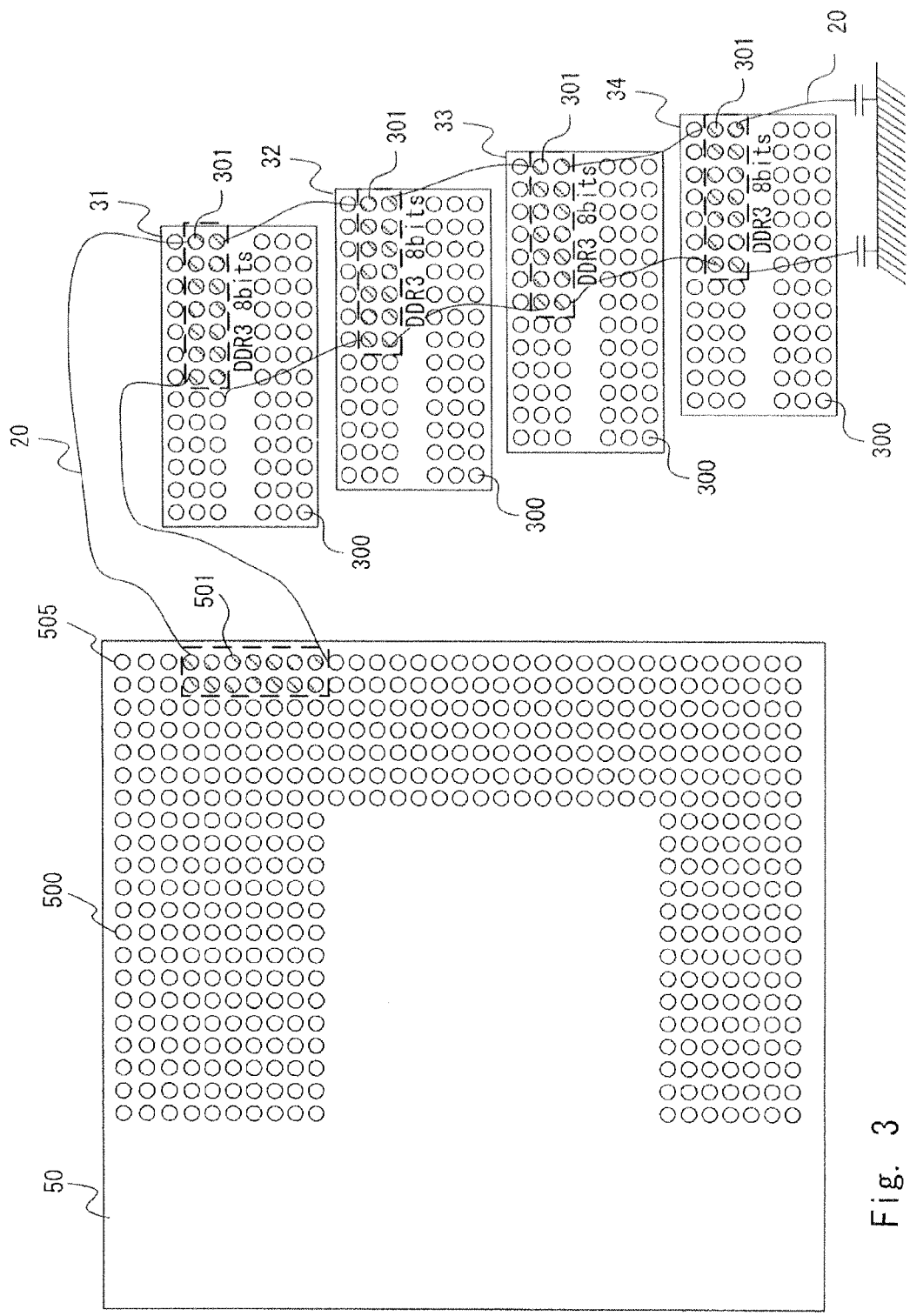
FIG. 3 is a plan view showing a layout of balls connected to address lines of a front surface wiring layer in a semiconductor device according to a first embodiment.
Figure 4:
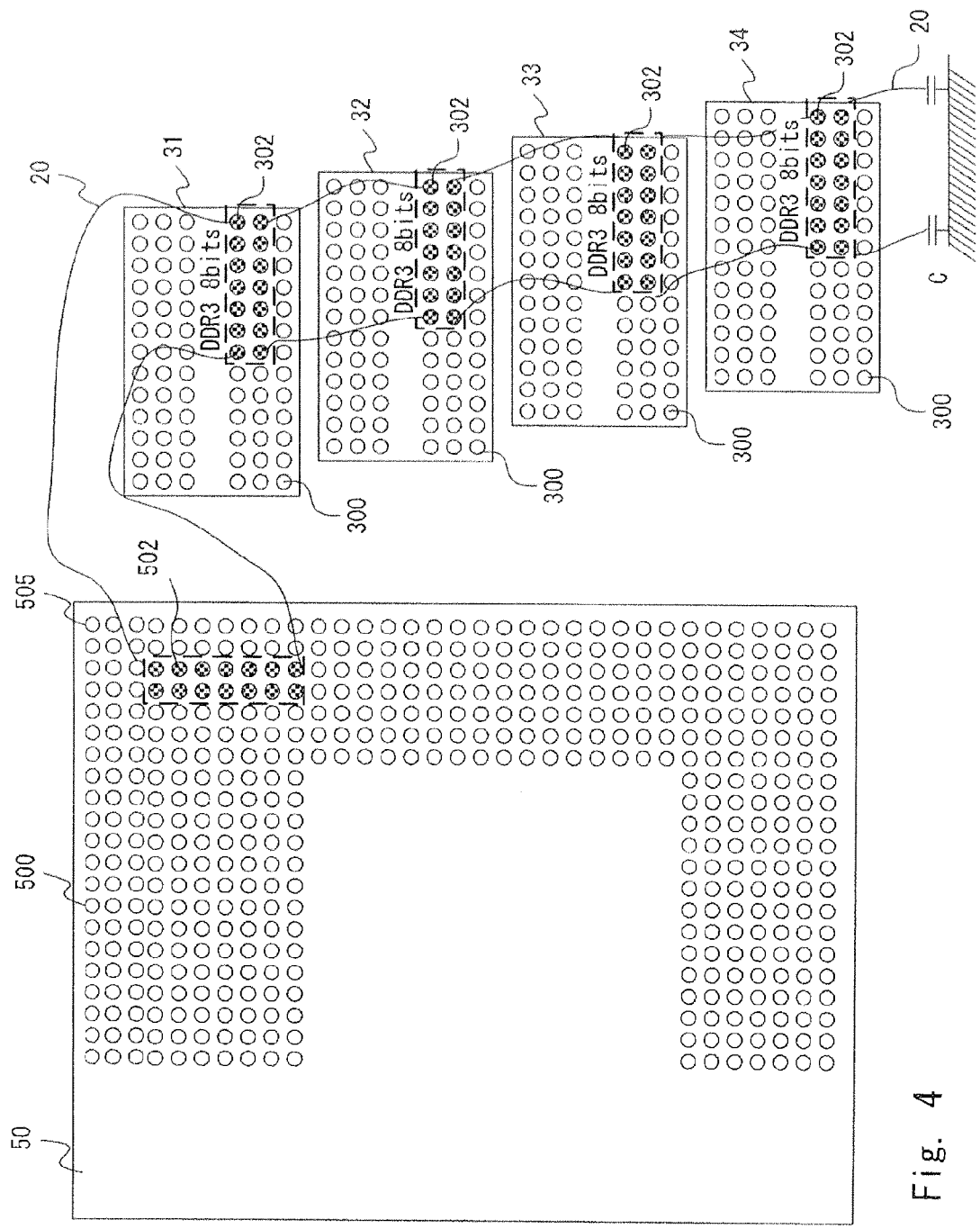
FIG. 4 is a plan view showing a layout of balls connected to address lines of a back surface wiring layer in the semiconductor device according to the first embodiment.

Referring next to FIGS. 3 and 4, the connection configuration address lines 20 will be described in detail. FIG. 3 is a ram schematically showing the connection configuration of the address lines 20 formed of the front surface wiring layer 11. FIG. 4 is a diagram schematically showing the connection configuration of the address lines 20 formed of the back surface wiring layer 12. As described later, the back surface wiring layer 12 is connected to the solder balls through vias formed in the mounting board 10.

FIGS. 3 and 4 show an array of the first balls 500 connected to the controller 50. That is, each of FIGS. 3 and 4 is a plan view viewed from the side of the mounting board 10 and schematically shows the layout of the balls. As shown in FIGS. 3 and 4, the controller 50 is connected with the first balls 500. Note that in FIGS. 3 and 4, some of the first balls 500 are omitted. Similarly, the first memory 31 to the fourth memory 34 are connected with the second balls 300. The first balls 500 are arranged in an array at substantially constant intervals. The second balls 300 are arranged in an array at substantially regular intervals. The interval between the balls may be 1 mm, for example.

Among the first balls 500, solder balls connected to the address lines 20 formed of the front surface wiring layer 11 are referred to as front surface layer balls 501 (see FIG. 3). Among the second balls 300, solder balls connected to the address lines 20 formed of the front surface wiring layer 11 are referred to as front surface layer balls 301. That is, the front surface layer 301 are connected to the front surface layer balls 501 through the front surface wiring layer 11.

Similarly, among the first balls 500, solder balls connected to the address lines 20 formed of the back surface wiring layer 12 are referred to as back surface layer balls 502 (see FIG. 4). In planar view, the back surface layer balls 502 are arranged on the left side of the front surface layer balls 501, i.e., on the inside. Among the second balls 300, solder balls connected to the address lines 20 formed of the back surface wiring layer 12 are referred to as back surface layer balls 302. That is, the back surface layer balls 502 are connected to the back surface layer balls 302 through the back surface wiring layer 12. In planar view, the back surface layer balls 302 are arranged on the lower side of the front surface layer balls 301, i.e., on the side of capacitors C.

Among the first balls 500, solder balls connected to clock lines on the mounting board 10 are referred to as clock balls 505. In planar view, the clock balls 505 are arranged in the corners of the controller 50 and in the peripheral areas thereof. The clock balls 505 are connected to clock terminals (not shown) of the first memory 31 to the fourth memory 34.

As shown in FIG. 3, the first balls 500 includes 14 front surface layer balls 501. That is, 14 address lines 20 which are formed of the front surface wiring layer 11 are formed on the mounting board 10. The 14 front surface layer balls 501 are arranged in an array of two rows×seven columns. Similarly, the first balls 500 include 14 back surface layer balls 502. That is, 14 address lines 20 formed of the back surface wiring layer 12 are formed on the mounting board 10. The 14 back surface layer balls 502 are arranged in an array of two rows×seven columns. Note that some of the 14 address lines 20 may serve as a shield line or a control signal line. In other words, address signals and address-related signals which are related to the address signals are transmitted to the address lines 20. The address signals are transmitted in parallel to the 14 address lines 20.

In this case, the number of the front surface layer balls 501 connected to the address lines 20 and the number of the back surface layer balls 502 connected to the address lines 20 are the same, but may be different from each other. For example, in consideration of routing of lines, the number of the back surface layer balls 502 may be set to be greater than the number of the front surface layer balls 501.

The address lines 20 connected to the front surface layer balls 501 and the address lines 20 connected to the back surface layer balls 502 are fly-by lines. Accordingly, the address lines 20 formed of the front surface wiring layer 11 are routed to the positions of the front surface layer balls 301 of the first memory 31 from the positions of the front surface layer balls 501. Further, each of the address lines 20 is sequentially routed from the positions of the front surface layer balls 301 of the first memory 31 to the positions of the front surface layer balls 301 of the second memory 32, the positions of the front surface layer balls 301 of the third memory 33, and the positions of the front surface layer balls 301 of the fourth memory 34. After being routed from the position of the fourth memory 34, the address lines 20 are connected to the ground on the mounting board 10 through the capacitors C. In this manner, the pattern of the front surface wiring layer 11 that constitutes the address lines 20 is laid out so as not to branch off. In other words, the pattern of the front surface wiring layer 11 that constitutes the address lines 20 is formed in a single stroke manner.

Similarly, the address lines 20 formed of the back surface wiring layer 12 are routed from the positions of the back surface layer balls 502 to the positions of the back surface layer balls 302 of the first memory 31. Further, each of the address lines 20 is sequentially routed from the positions of the back surface layer balls 302 of the first memory 31 to the positions of the back surface layer balls 302 of the second memory 32, the positions of the back surface layer balls 302 of the third memory 33, and the positions of the back surface layer balls 302 of the fourth memory 34. After being routed from the position of the fourth memory 34, the address lines 20 are connected to the ground on the mounting board 10 through the capacitors C. The pattern of the back surface wiring layer 12 that constitutes the address lines 20 is laid out so as not to branch off. In other words, the pattern of the back surface wiring layer 12 that constitutes the address lines 20 is formed in a single stroke manner.

In planar view, the front surface layer balls 501 are arranged on the end side of the controller 50 relative to the back surface layer balls 502. Specifically, the front surface layer balls 501 are arranged at positions closer to the outer end of the controller 50 on the side of the memory relative to the back surface layer balls 502. Further, the front surface layer balls 501 are arranged at positions closer to the first memory 31 to the fourth memory 34 relative to the back surface layer balls 502. In this case, the front surface layer balls 501 are arranged in an outermost column (right-end column in FIGS. 3 and 4) of the first ball group 5 and in a column on the left side of the outermost column (hereinafter referred to as a second column). The back surface layer balls 502 are arranged in a column on the left side of the second column of the first ball group 5 (hereinafter referred to as a third column) and in a column on the left side of the third column (hereinafter referred to as a fourth column).

The address lines 20 are laid out so as not to be connected to adjacent address lines 20 and other lines. For example, the address lines 20 formed of the front surface wiring layer 11 are routed away from other lines and lands for solder balls.

Thus, some address lines among the plurality of address lines 20 in the fly-by connection are formed of the front surface wiring layer 11, and connect the front surface layer balls 501 and the front surface layer balls 301. The remaining address lines 20 are formed of the back surface wiring layer 12, and connect the back surface layer balls 502 and the back surface layer balls 302. That is, the address lines 20 are grouped into two groups, i.e., the address lines 20 that are connected to a first wiring layer and the address lines 20 that are connected to a second wiring layer which is different from the first wiring layer.

This configuration makes it possible to reduce the number of the address lines 20 passing through the space between the first balls 500 that are arranged in an array. As for lines between the DDR3 memories that handle a high frequency of 1600 MHz, interference may occur in two lines between balls. Accordingly, it is necessary to dispose one line between balls. This makes it possible to narrow the pitch of the first balls 500 and increase the number of signal lines. Since the number of balls is large, a sufficiently large number of grounds can be obtained. In other words, the number of the first balls 500 for ground which are included in the first ball group 5 can be increased, resulting in an improvement in resistance to noise. Furthermore, the grouping of the address lines 20 into two groups facilitates design of a line layout. It is also possible to group the address lines 20 into three or more layers.

Further, in planar view, the front surface layer balls 501 of the address lines 20 formed of the front surface wiring layer 11 are arranged on the outer peripheral side of the controller 50. This eliminates the need to remove some of the first balls 500 so as to route the address lines 20 formed of the front surface wiring layer 11. A larger number of balls can be arranged. That is, the first balls 500 which are arranged in an array can be arranged at regular intervals. Since there is no need to remove a part of the controller 50 having an array shape, a larger number of signals can be taken. Furthermore, since the number of balls is large, a sufficiently large number of grounds can be obtained. That is, the number of the first balls 500 for ground which are included in the first ball group 5 can be increased, resulting in an improvement in resistance to noise.

At least a part of the solder balls of the front surface layer balls 301 is arranged in the outermost column that is closest to the first memory 31 to the fourth memory 34. With this configuration, the length of each line can be shortened and a signal delay can be reduced.

Figure 5:
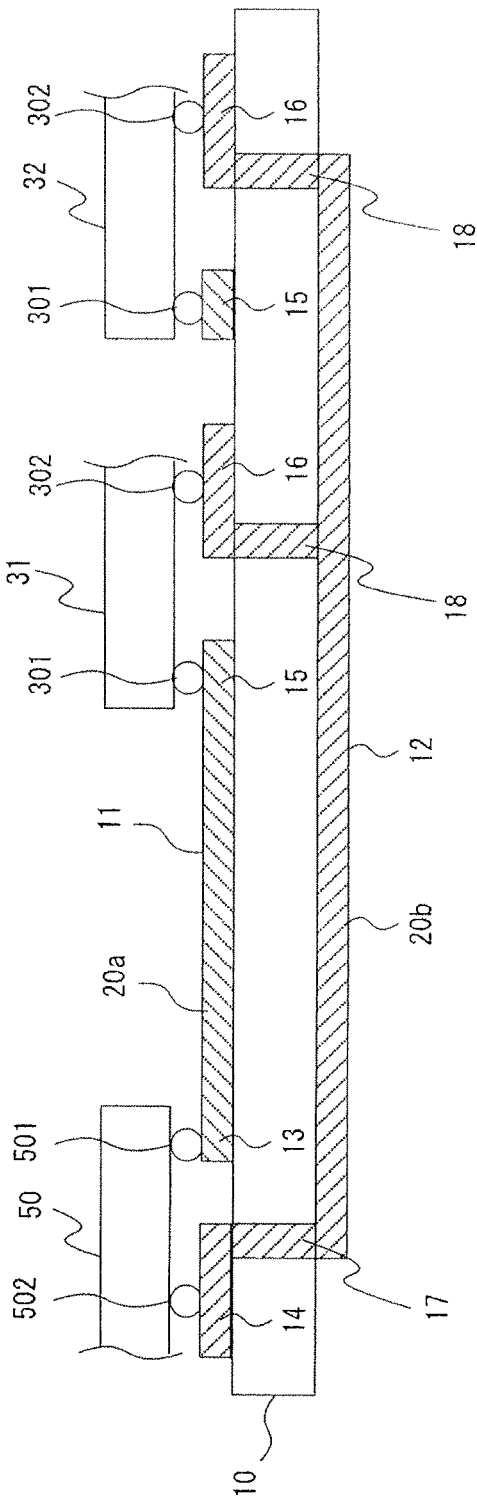
FIG. 5 is a sectional view schematically showing a connection configuration of address lines.

Next, the cross-section structure of the address lines 20 formed of the front surface wiring layer 11 and of the address lines 20 formed of the back surface wiring layer 12 will be described with reference to FIG. 5. FIG. 5 is a sectional view schematically showing the configuration of the mounting board 10. Though FIG. 5 shows only the first memory 31 and the second memory 32, the third memory 33 and the fourth memory 34 also have a similar cross-section structure.

As shown in FIG. 5, each back surface layer ball 502 is arranged on a land 14. Similarly, each front surface layer ball 501 is arranged on a land 13. Each front surface layer ball 301 is arranged on a land 15. Each back surface layer ball 302 is arranged on land 16. The lands 13 and 15 are connected through the front surface wiring layer 11. In other words, an address line 20*a* that connects the lands 13 and 15 is formed of the front surface wiring layer 11. In this case, the address line 20*a* formed of the front surface wiring layer 11 is formed so as to pass through the space between the lands 13 of the adjacent address lines 20. That is, the address line 20*a* formed of the front surface wiring layer 11 is routed so as not to contact the lands 13 for other address lines 20 and the first balls 500. The lands 13 to 16 are formed of the front surface wiring layer 11.

Although not shown in FIG. 5, the land 15 formed immediately below the first memory 31 and the land 15 formed immediately below the second memory 32 are connected with the pattern of the front surface wiring layer 11. Similarly, the pattern of the front surface wiring layer 11 serving as the address line 20*a* is also connected to lands that are formed immediately below the third memory 33 and the fourth memory 34. For example, the lands 15 that are formed immediately below the first memory 31 to the fourth memory 34 are connected with the pattern of the front surface wiring layer 11 which is routed between the lands 15 and 16 for other address lines 20. With this configuration, the address line 20a formed of the front surface wiring layer 11 enables the fly-by connection of the first memory 31 to the fourth memory 34.

The back surface wiring layer 12 is connected to via lines 17 and 18 which penetrate the mounting board 10. The via line 17 is connected to the land 14. The via line 18 is connected to the land 16. The back surface wiring layer 12 is connected to the via lines 17 and 18. Accordingly, the land 14 is connected to the back surface wiring layer 12 through the via line 17, and the land 16 is connected to the back surface wiring layer 12 through the via line 18. The land 14 is connected to the land 16 through each of the via line 17, the back surface wiring layer 12, and the via line 18. Accordingly, an address line 20b that connects the lands 16 which are formed immediately below the first memory 31 to the fourth memory 34 is formed of the back surface wiring layer 12.

The address line 20b, which is a fly-by line, includes a plurality of via lines 18. Specifically, a single address line 20b is connected to the first memory 31 to the fourth memory 34 and thus includes four via lines 18. The via line 17 is arranged at a position shifted from the positions of the front surface layer balls 501 of the land 14. In other words, the back surface layer balls 502 and the via line 17 are arranged so as not to overlap each other in planar view.

The address line 20b formed of the back surface wiring layer 12 is connected to the via line 17 in the vicinity of the back surface layer balls 502. Accordingly, there is no need to cause the address lines 20b formed of the back surface wiring layer 12 to pass through the space between the lands 13 and 14 of other address lines 20. On the other hand, the address line 20a formed of the front surface wiring layer 11 needs to be formed to pass through the space between the lands 13 of other address lines 20. The lands 13 are arranged at the outer end side of the controller 50 relative to the lands 14. This allows the lands 14 to be arranged at regular intervals. Thus, the number of signals can be increased.

Figure 6:
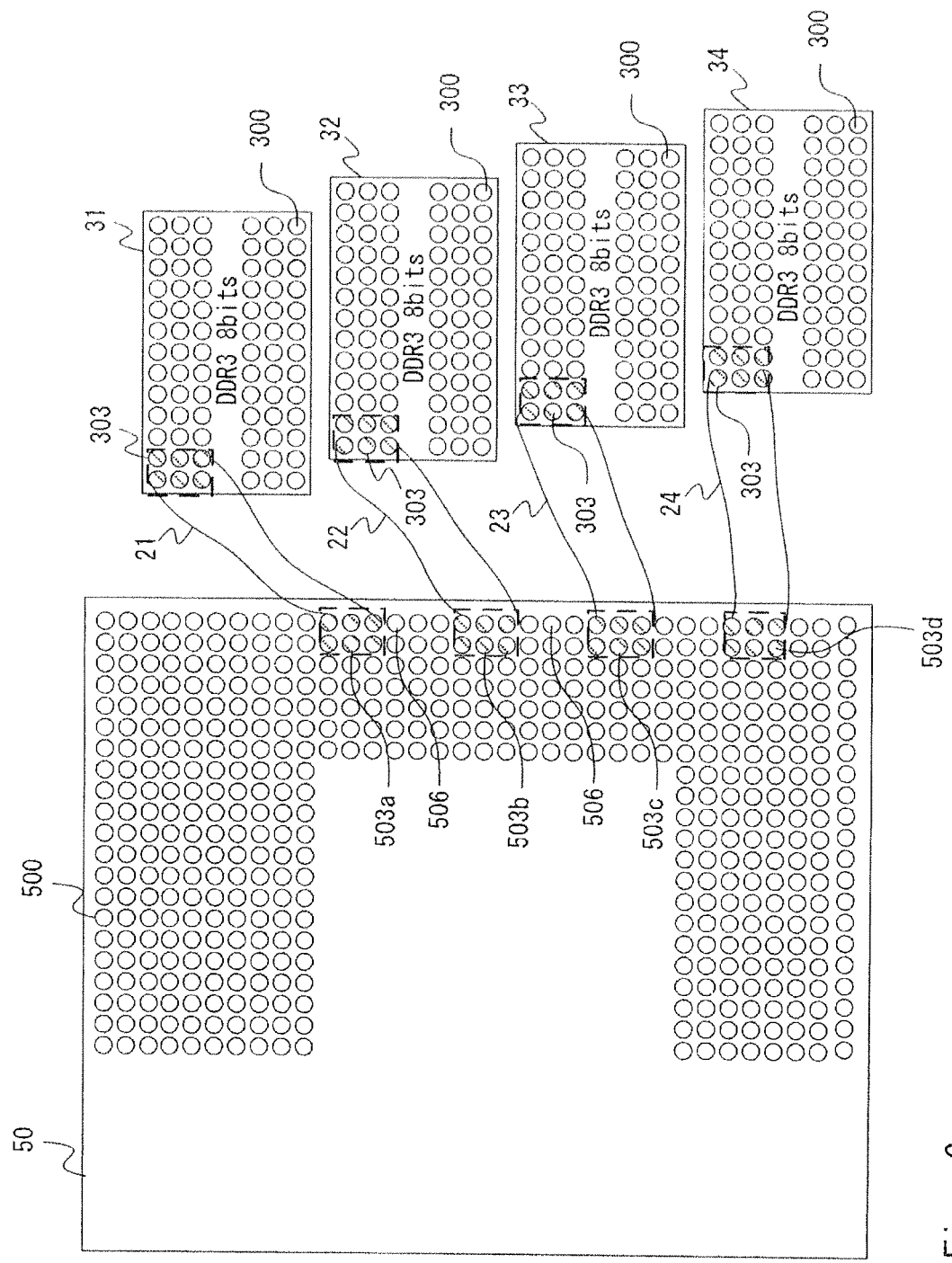
FIG. 6 is a plan view showing a layout of balls connected to data lines of the front surface wiring layer in the semiconductor device according to the first embodiment.
Figure 7:
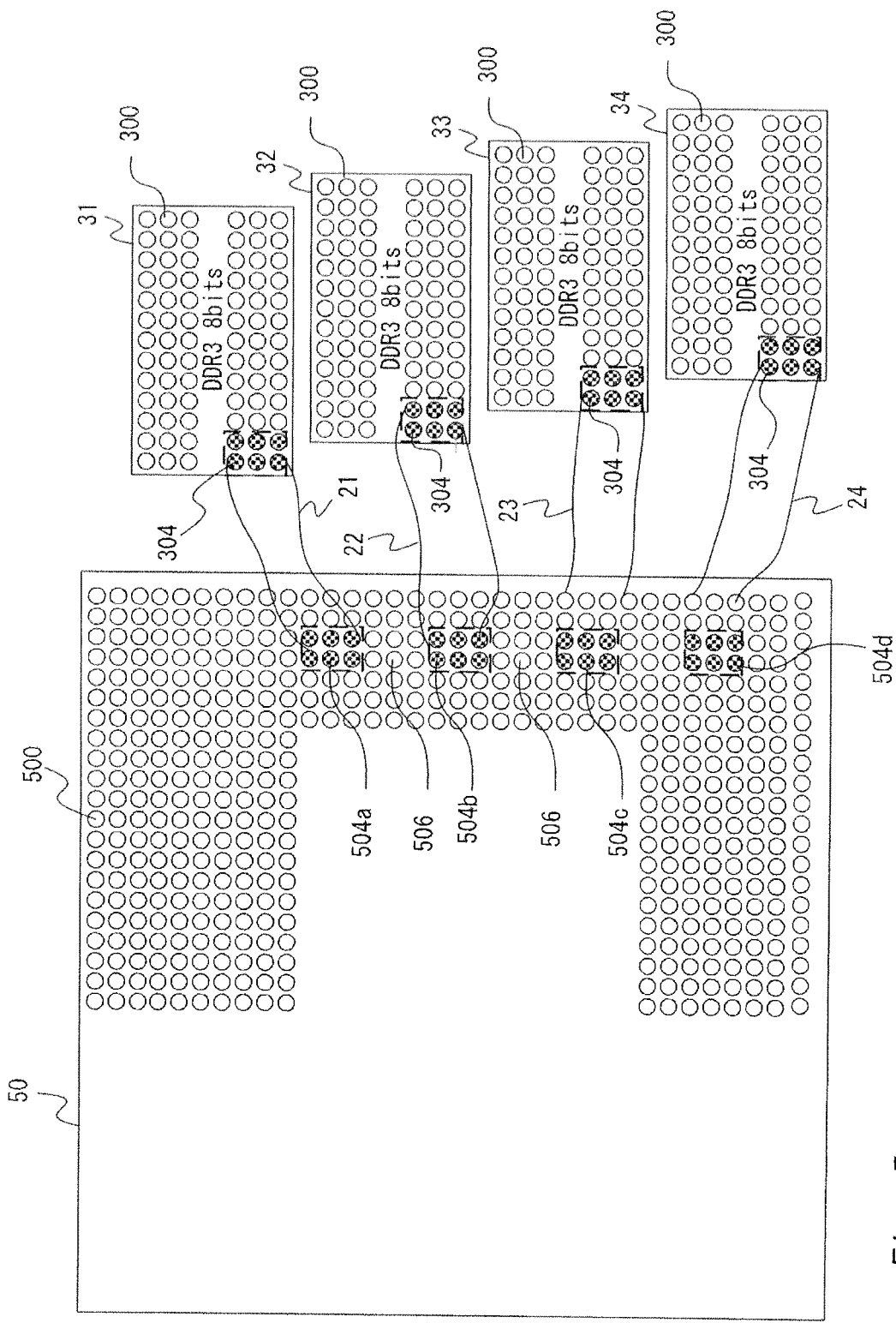
FIG. 7 is a plan view showing a layout of balls connected to data lines of the back surface wiring layer in the semiconductor device according to the first embodiment.

Next, the connection configuration of the data lines 21 to 24 will be described with reference to FIGS. 6 and 7. FIG. 6 is a plan view schematically showing the configuration of the data lines 21 to 24 which are formed of the front surface wiring layer 11. FIG. 7 is a plan view schematically showing the configuration of the data lines 21 to 24 which are formed of the back surface wiring layer 12. The data lines 21 to 24 are not fly-by lines, unlike the address lines 20. The cross-section structure except for the fly-by connection is basically similar to that of FIG. 5.

As shown in FIG. 6, among the first balls 500, solder balls connected to the data lines 21 to 24 formed of the front surface wiring layer 11 are referred to as front surface layer balls 503a to 503d. Among the front surface layer balls 503a to 503d, solder balls connected to the first memory 31 are referred to as the front surface layer balls 503a, and solder balls connected to the second memory 32 are referred to as the front surface layer balls 503b. Similarly, solder balls connected to the third memory 33 are referred to as the front surface layer ball 503c, and solder balls connected to the fourth memory 34 are referred to as the front surface layer ball 503d.

The number of each of the front surface layer balls 503a to 503d is six. The front surface layer balls 503a to 503d are respectively connected to the data lines 21 to 24 of the front surface wiring layer 11 through the lands as described above.

In each of the first memory 31 to the fourth memory 34, solder balls connected to the data lines 21 to 24 formed of the front surface wiring layer 11 are referred to as front surface layer balls 303. Each of the first memory 31 to the fourth memory 34 is connected to six front surface layer balls 303.

As shown in FIG. 7, among the first balls 500, solder balls connected to the data lines 21 to 24 formed of the back surface wiring layer 12 are referred to as back surface layer balls 504a to 504d. Among the back surface layer balls 504a to 504d, solder balls connected to the first memory 31 are referred to as the back surface layer balls 504a, and solder balls connected to the second memory 32 are referred to as the back surface layer ball 504b. Similarly, solder balls connected to the third memory 33 are referred to as the back surface layer balls 504c, and solder balls connected to the fourth memory 34 are referred to as the back surface layer ball 504d.

The number of each of the back surface layer balls 504a to 504d is six. The back surface layer balls 504a to 504d are respectively connected to the data lines 21 to 24 of the back surface wiring layer 12 through the lands as described above.

In each of the first memory 31 to the fourth memory 34, solder balls connected to the data lines 21 to 24 formed of the back surface wiring layer 12 are referred to as back surface layer balls 304. Each of the first memory 31 to the fourth memory 34 is connected to six back surface layer balls 304.

The six front surface layer balls 503a and the six back surface layer balls 504a are formed. Accordingly, the first memory 31 is connected to the six front surface layer balls 303 and the six back surface layer balls 304. In other words, 12 data lines 21 which are connected to the first memory 31 are formed on the mounting board 10. The 12 data lines 21 are divided into two groups, i.e., the data lines 21 that are formed of the front surface wiring layer 11 and the data lines 21 that are formed of the back surface wiring layer 12. Similarly, each of the second memory 32 to the fourth memory 34 is connected to six front surface layer balls 303 and six back surface layer balls 304. In other words, 12 data lines 22, 12 data lines 23, and 12 data lines 24 are formed on the mounting board 10. Each of the data lines 21 to 24 includes six data lines formed of the front surface wiring layer 11 and six data lines formed of the back surface wiring layer 12. This eliminates the need to remove some of the solder balls, resulting in an increase in the number of signals.

In planar view, the front surface layer balls 503a are arranged on the outer peripheral side of the controller 50 relative to the back surface layer balls 504a. Similarly, in planar view, the front surface layer balls 503b to 503d are arranged on the outer peripheral side of the controller 50 relative to the back surface layer balls 504b to 504d, respectively. Specifically, the front surface layer balls 503 are arranged in the outermost column and in the second column. The back surface layer balls 504a are arranged in the third column and the fourth column. In this manner, the six front surface layer balls 503a and the six back surface layer balls 504a are arranged adjacent to each other.

Some of the twelve data lines 21 may serve as a shield line or a control signal line. In other words, data signals and data-related signals which are related to the data signals are transmitted to the data lines 21. Further, 12 data lines 22, 12 data lines 23, and 12 data lines 24 are formed. The data lines 22, the data lines 23, and the data lines 24 transmit the data signals and data-related signals.

For example, because the six front surface layer balls 303 transmit 4-bit data in parallel, the four front surface layer balls 303 are used to transmit the data signals and the remaining two front surface layer balls 303 are used to transmit the data-related signals. Similarly, because the back surface layer balls 304 also transmit 4-bit data in parallel, the two front surface layer balls 303 are used to transmit the data-related signals.

In planar view, the back surface layer balls 504a to 504d are arranged on the inner side of the controller 50 relative to the front surface layer balls 503a to 503d. This configuration facilitates routing of the data lines 21 to 24 as with the address lines 20. That is, the lines formed of the front surface wiring layer 11 are arranged on the outer peripheral side of the controller 5U. This configuration facilitates routing of the pattern of the front surface wiring layer 11. The first balls 500 formed between the groups of the front surface layer balls 503a to the front surface layer balls 503d, which are respectively connected to the data lines 21 to 24, may serve as shield line solder balls 506. The first balls 500 formed between the groups of the back surface layer balls 504a to the back surface layer balls 504d, which are respectively connected to the data lines 21 to 24, may serve as shield line solder balls 506. For example, the first balls 500 formed between the groups of the front surface layer balls 503a and the front surface layer balls 503b may serve as the shield line solder balls 506. This results in an improvement in shielding performance. The solder balls formed between any other groups of the front surface layer balls 503a to the front surface layer balls 503d and solder balls formed between any other groups of the back surface layer balls 504a to the back surface layer balls 504d may also be used as the shield line solder balls.

Further, the first balls 500 are grouped for each memory and arranged in an array. Specifically, the front surface layer balls 503a and the back surface layer balls 504a, which are connected to the data lines 21, are collectively arranged. Similarly, the front surface layer balls 503b and the back surface layer ball 504b, which are connected to the data lines 22, are collectively arranged. The front surface layer balls 503c and the back surface layer balls 504c are also collectively arranged, and the back surface layer balls 504d and the front surface layer balls 503d are also collectively arranged. This configuration facilitates the layout design.

Second Embodiment

Figure 8:
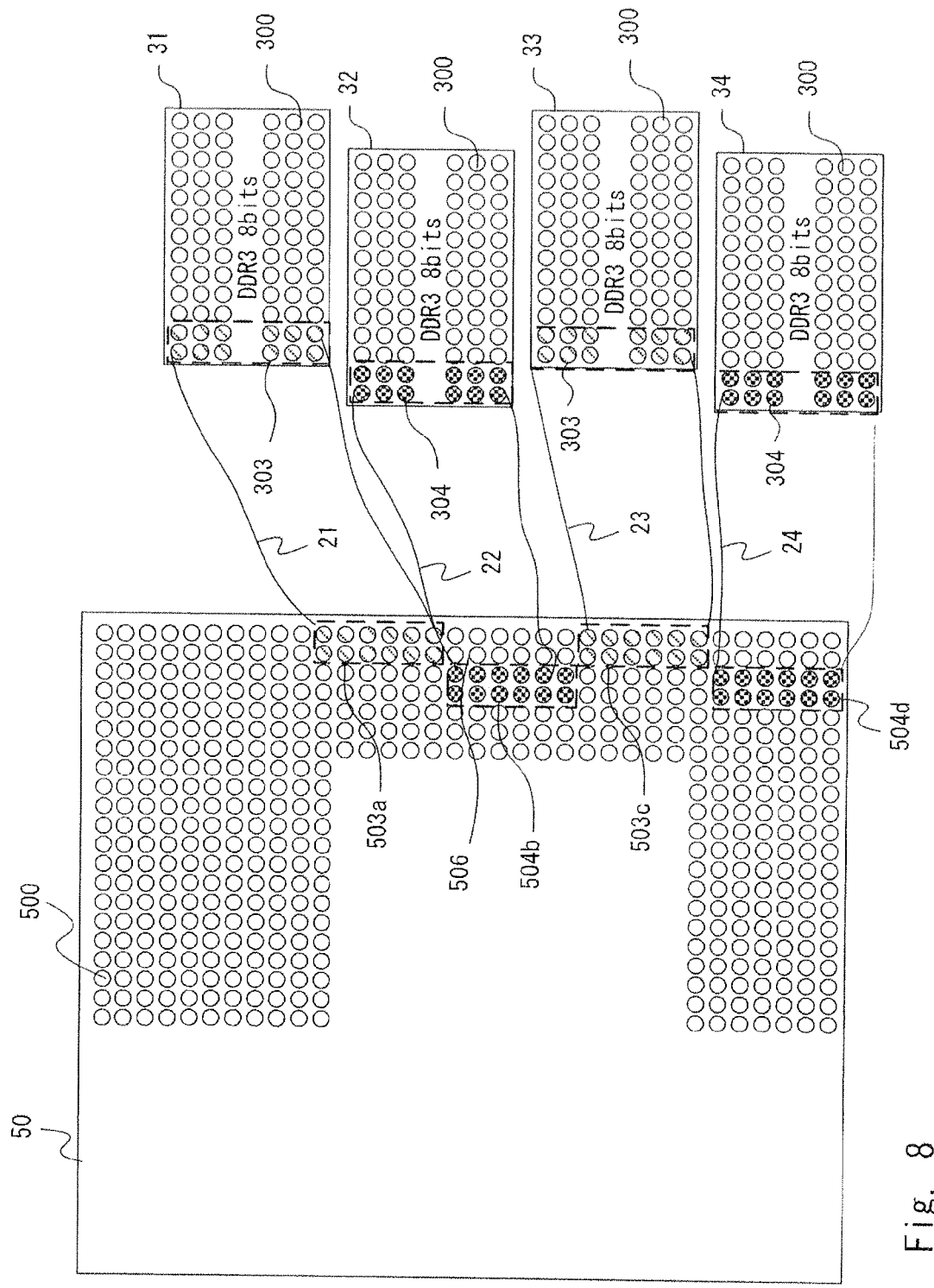
FIG. 8 is a plan view showing a layout of balls connected to data lines in a semiconductor device according to a second embodiment.

Next, a semiconductor device according to a second embodiment will be described with reference to FIG. 8. FIG. 8 is a diagram showing a layout of solder balls connected to the data lines 21 to 24. In the second embodiment, the arrangement of solder balls and memories is different from that of the first embodiment. Note that the basic configuration of the semiconductor device is similar to that of the first embodiment, so the description thereof is omitted as appropriate.

In the second embodiment, wiring layers connected to solder balls are different for each memory. Specifically, in the first memory 31, all solder balls connected to all the data lines 21 serve as the front surface layer balls 303. Similarly, in the third memory 33, all solder balls connected to all the data lines 23 serve as the front surface layer balls 303. On the other hand, in the second memory 32, all solder balls connected to all the data lines 22 serve as the back surface layer balls 304. Similarly, in the fourth memory 34, all solder balls connected to all the data line 24 serve as the back surface layer balls 304. A plurality of data lines connected to one memory is formed of one of the front surface wiring layer 11 and the back surface wiring layer 12. The grouping of the first balls 500 in this manner facilitates the layout design.

Further, the first balls 500 are grouped for each memory and arranged in an array. Specifically, the front surface layer balls 503a connected to the data lines 21 are collectively arranged. Similarly, the back surface layer balls 504b connected to the data lines 22 are collectively arranged. The front surface layer balls 503c connected to the data lines 23 are collectively arranged. The back surface layer balls 504d connected to the data lines 24 are collectively arranged. This configuration facilitates the layout design. Furthermore, the data lines in each memory can be formed with a uniform length. This makes it possible to reliably load data.

Among the first memory 31 to the fourth memory 34, the memories connected to the front surface layer balls 303 and the memories connected to the back surface layer balls 304 are alternately arranged. Accordingly, the first memory 31 and the third memory 33, which are connected to the front surface layer balls 303, are arranged on both sides of the second memory 32 connected to the back surface layer balls 304. Similarly, the second memory 32 and the fourth memory 34, which are connected to the back surface layer balls 304, are arranged on both sides of the third memory 33 connected to the front surface layer balls 303. This configuration facilitates the design.

Further, shield lines can be formed between the data lines of each memory. For example, the solder balls formed between the groups of the front surface layer balls 503a and the front surface layer balls 503c may serve as the shield line solder balls 506. Similarly, the solder balls formed between the groups of the back surface layer balls 504b and the back surface layer balls 504d may serve as the shield line solder balls 506. This results in an improvement in shielding performance.

Furthermore, the first memory 31 to the fourth memory 34 are arranged in a staggered manner. A distance between the first memory 31 and the controller 50 is equal to a distance between the third memory 33 and the controller 50. A distance between the second memory 32 and the controller 50 is equal to a distance between the fourth memory 34 and the controller 50. The distance between the first memory 31 and the controller 50 is longer than the distance between the second memory 32 and the controller 50. In other words, the distance between each memory connected to the front surface layer balls 303 and the controller is longer than the distance between each memory connected to the back surface layer balls 304 and the controller. This configuration allows the data lines 21 to 24 to be formed with a uniform length. The formation of the data lines with a uniform length makes it possible to reliably load data even in the case of using high-speed clocks.

Third Embodiment

Figure 9:
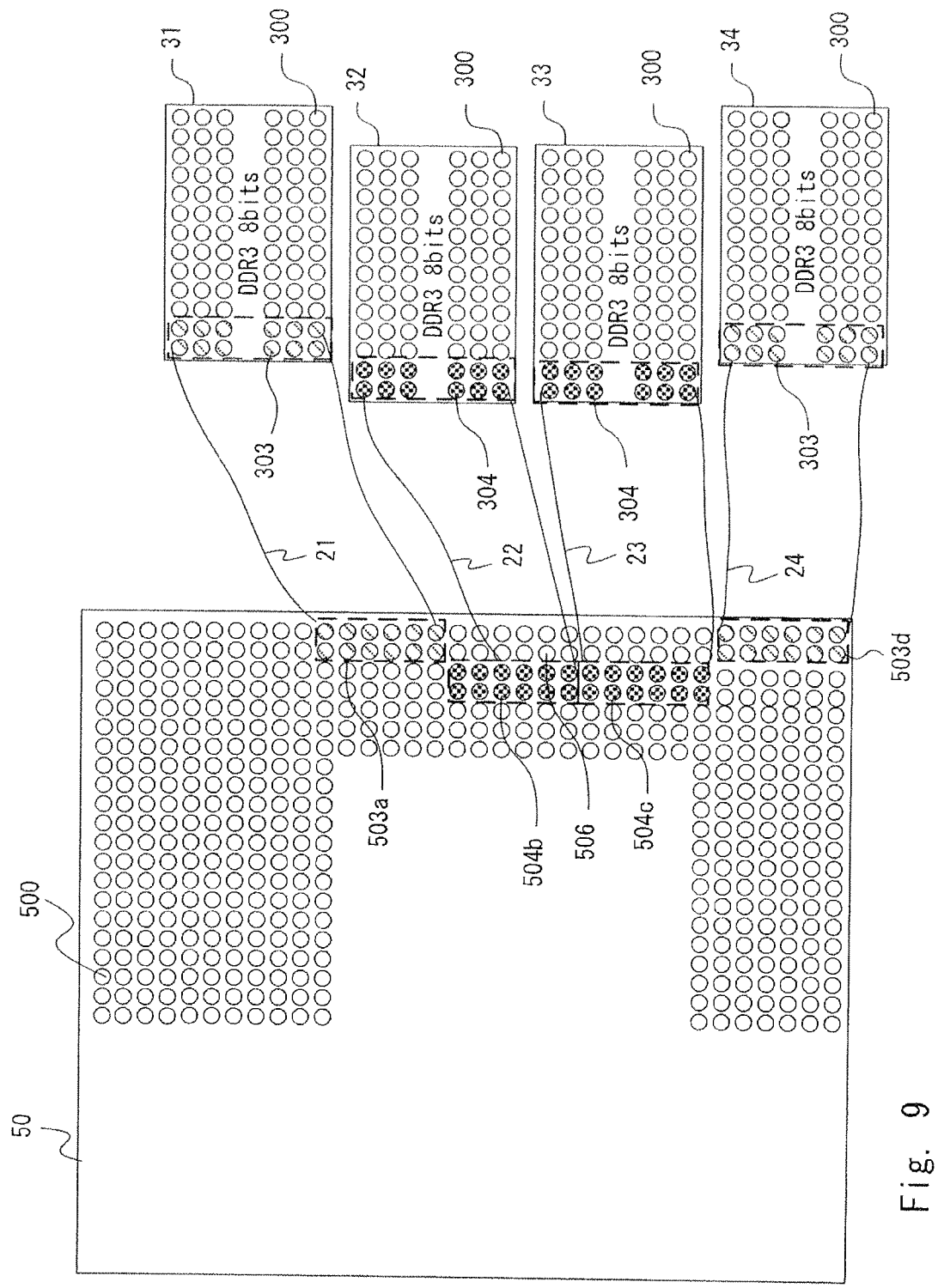
FIG. 9 is a plan view showing a layout of balls connected to data lines in a semiconductor device according to a third embodiment.

A semiconductor device according to a third embodiment will be described with reference to FIG. 9. FIG. 9 is a diagram showing a layout of solder balls connected to the data lines 21 to 24. In the third embodiment, the arrangement of solder balls and memories is different from that of the second embodiment. Note that the basic configuration of the semiconductor device is similar to that of the first and second embodiments, so the description thereof is omitted as appropriate.

In the third embodiment, the arrangement of solder balls connected to the data lines 21 to 24 is different from that of the second embodiment. Specifically, in the second memory 32 and the third memory 33, all solder balls connected to the data lines 22 and 23 serve as the back surface layer balls 304. In the first memory 31 and the fourth memory 34, all solder balls connected to the data lines 21 and 24 serve as the front surface layer balls 303. A plurality of data lines connected to one memory is formed of one of the front surface wiring layer 11 and the back surface wiring layer 12. With this configuration, the data lines in each memory can be formed with a uniform length. This makes it possible to reliably load data.

Accordingly, the group of the back surface layer balls 504b and the group of the back surface layer balls 504c are arranged adjacent to each other. That is, the second memory 32 and the third memory 33, which are connected to the back surface layer balls 304, are arranged adjacent to each other. This layout increases the degree of freedom of design. For example, the solder balls 506 located on the end side of the controller 50 relative to the back surface layer balls 504b and the back surface layer balls 504c may be used as the solder balls connected to the address lines 20. The solder balls 506 may also be used as the shield line solder balls. In this configuration, shield lines can be formed between the data lines 21 and 24, which results in and improvement in shielding performance.

As in the second embodiment, the distance between each of the first memory 31 and the fourth memory 34, which are the memories connected to the front surface layer balls 303, and the controller is longer than the distance between each of the memories connected to the back surface layer balls 304 and the controller. This allows the data lines to be formed with a uniform length, thereby making it possible to reliably load data. Further, in planar view, the back surface layer balls 504b and the back surface layer balls 504c are arranged on the inner side of the controller 50 relative to the front surface layer balls 503a and the front surface layer balls 503d. This configuration facilitates routing of the data lines 21 to 24.

Fourth Embodiment

Figure 10:
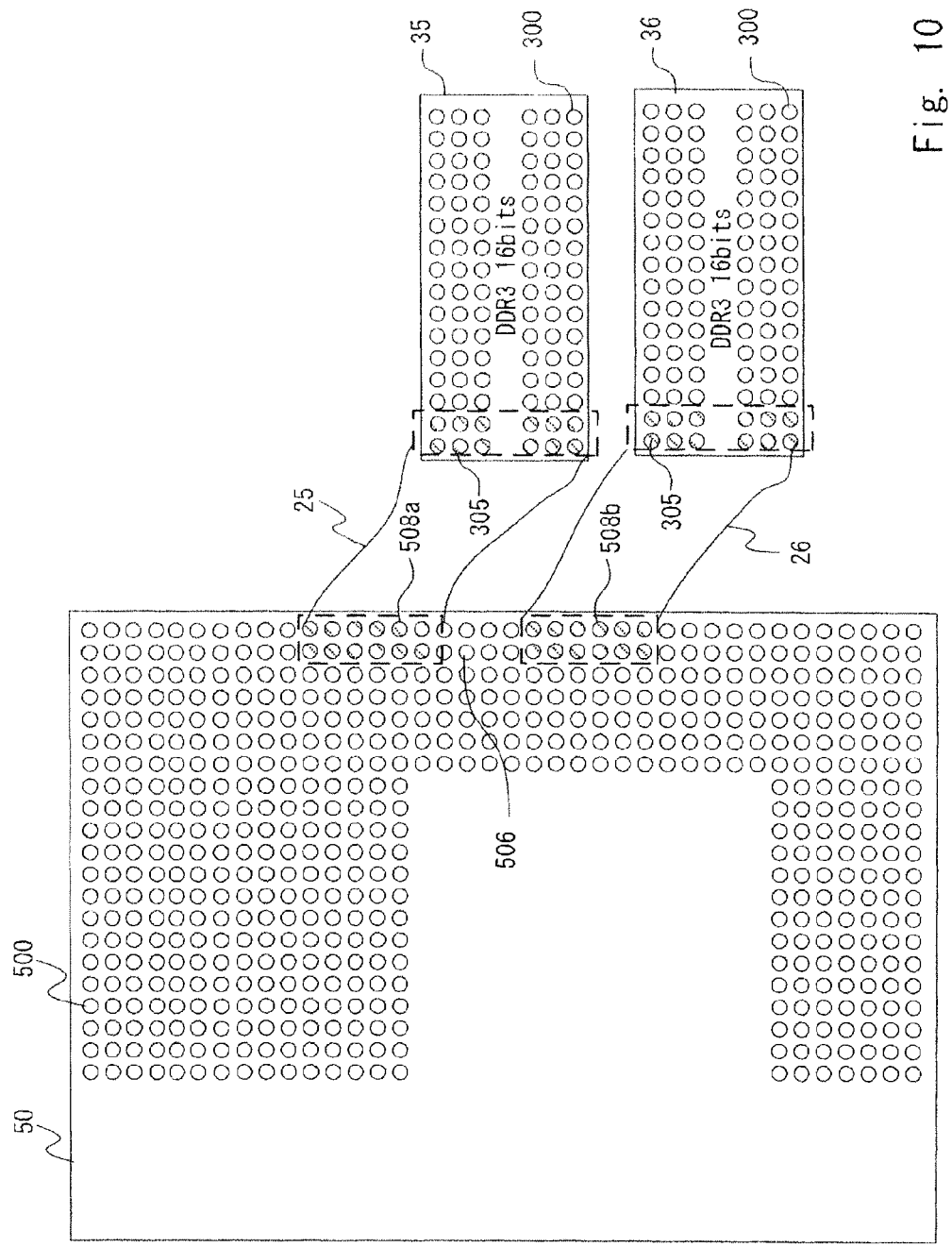
FIG. 10 is a plan view showing a layout of balls connected to address lines of a front surface wiring layer in a semiconductor device according to a fourth embodiment.
Figure 11:
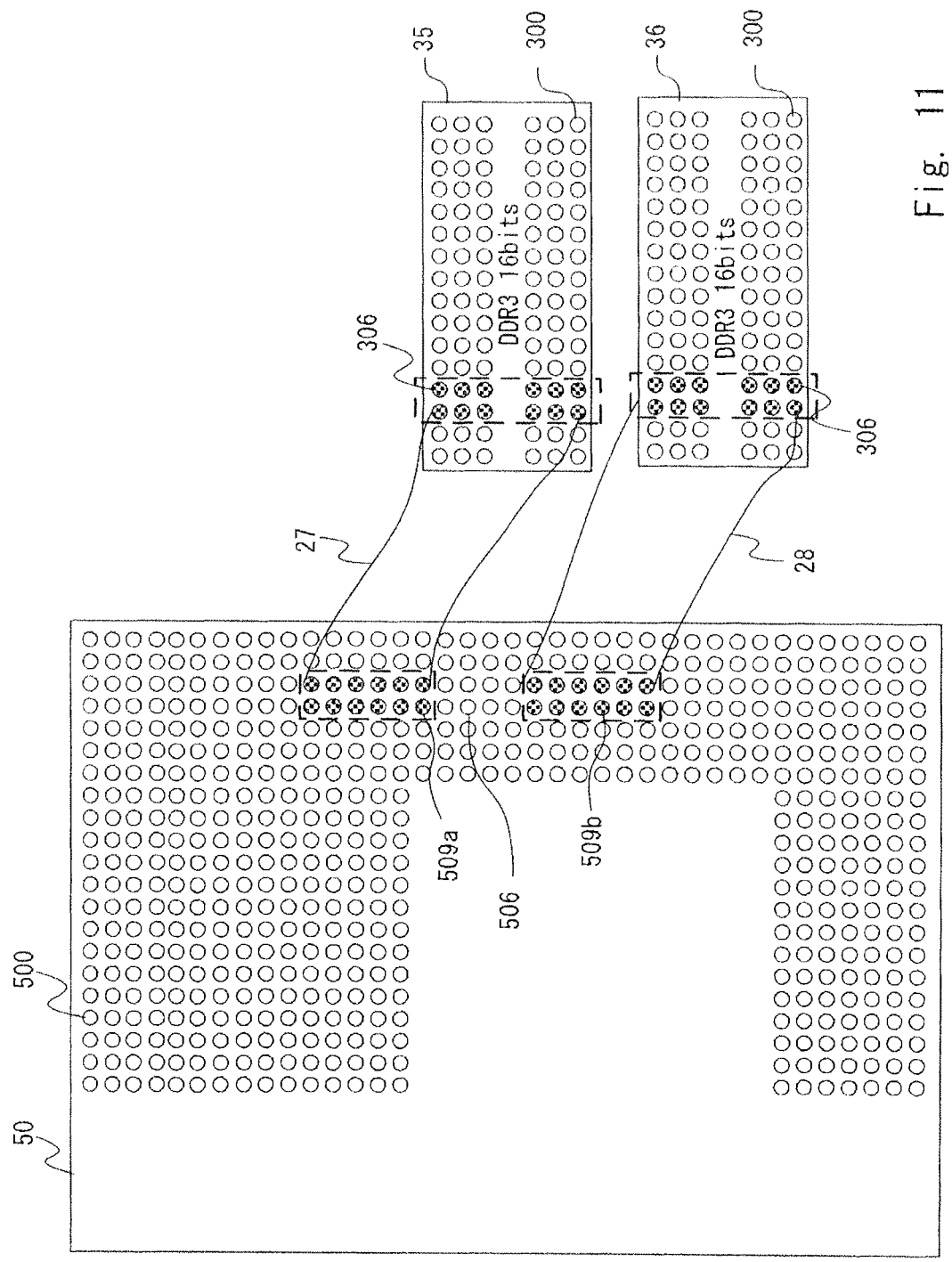
FIG. 11 is a plan view showing a layout of balls connected to address lines of a back surface wiring layer in the semiconductor device according to the fourth embodiment.

In a fourth embodiment, two 16-bit DDR3 memories are used, unlike the first to third embodiments. A semiconductor device according to the fourth embodiment will be described with reference to FIGS. 10 and 11. Each of FIGS. 10 and 11 shows a configuration including two 16-bit DDR memories, i.e., a fifth memory 35 and a sixth memory 36. FIG. 10 is a plan view schematically showing a layout of solder balls connected to data lines formed of the surface wiring layer 11. FIG. 11 is a plan view schematically showing a layout of solder balls connected data lines formed of the back surface wiring layer 12. Note that the basic configuration of the semiconductor device is similar to that of the first embodiment, so the description thereof is omitted as appropriate.

As shown in FIG. 10, among the data lines formed of the front surface wiring layer 11, a data line connected to the fifth memory 35 is referred to as a data line 25, and a data line connected to the sixth memory 36 is referred to as a data line 26. As shown in FIG. 11, among the data lines formed of the back surface wiring layer 12, a data line connected to the fifth memory 35 is referred to as a data line 27, and a data line connected to the sixth memory 36 is referred to as a data line 28. As shown in FIG. 10, the first balls 500 connected to the data line 25 are referred to as front surface layer balls 508a, and the first balls 500 connected to the data line 28 are referred to as front surface layer balls 508b. As shown in FIG. 11, the first balls 500 connected to the data line 27 are referred to as back surface layer balls 509a, and the first balls 500 connected to the data line 28 are referred to as back surface layer balls 509b. Among the second balls 300, solder balls connected to the data lines 25 and 26 formed of the front surface wiring layer 11 are referred to as front surface layer balls 305, and solder balls connected to the data lines 27 and 28 formed of the back surface wiring layer 12 are referred to as back surface layer balls 306. In this embodiment, the front surface layer balls 508a and 508b and the back surface layer halls 509a and 509b are arranged in the same manner as in the arrangement of the front surface layer balls 503a and 503b and the back surface layer balls 504a and 504b which are illustrated in the first embodiment.

As shown in FIGS. 10 and 11, the fifth memory 35 includes six front surface layer balls 305 and six back surface layer balls 306. Similarly, the sixth memory 36 includes six front surface layer balls 305 and six back surface layer balls 306. Accordingly, the semiconductor device includes six front surface layer balls 508a, six front surface layer balls 508b, six back surface layer balls 509a, and six back surface layer balls 509b.

The front surface layer balls 508a and the back surface layer balls 509a, which are connected to the fifth memory 35, are collectively arranged. The front surface layer balls 508b and the back surface layer balls 509b, which are connected to the sixth memory 36, are collectively arranged. This configuration facilitates the layout design.

The front surface layer balls 508a are arranged at an end on the side of the fifth memory 35 relative to the back surface layer balls 509a. The front surface layer balls 508b are arranged at an end on the side of the fifth memory 35 relative to the back surface layer balls 509b. In planar view, the front surface layer balls 508a and the front surface layer balls 508b are arranged on the end side of the controller 50. This facilitates routing of the data lines 25 to 28.

Further, solder balls formed between the groups of the front surface layer balls 508a and the front surface layer balls 508b may serve as the shield line solder balls. Solder balls formed between the groups of the back surface layer balls 509a and the back surface layer balls 509b may serve as the shield line solder balls. This results in an improvement in shielding performance.

In planar view, the back surface layer balls 509a and the back surface layer balls 509b are arranged on the inner side of the controller 50 relative to the front surface layer balls 508a and the front surface layer balls 508b. This configuration facilitates routing of the data lines 25 to 28. Thus, also in the semiconductor device having 16-bit DDR3 memories mounted thereon, the same advantageous effect as that of the first embodiment can be obtained. Also in the 16-bit DDR3 memories, the configuration illustrated in the second embodiment or the third embodiment can be used.

Other Embodiment

Though the first to fourth embodiments illustrate the configuration in which two or four memories are provided, the number of memories is not particularly limited. The memories are arranged on the right side of the controller 50, but may be arranged in any location other than the right side of the controller 50. The memories may be arranged in two or more locations of the controller 50. For example, a plurality of memories may be arranged on the right side and on the lower side of the controller 50. The configurations described above are also applicable to memories other than the DDR3 memory.

The invention made by the present inventor has been described above with reference to embodiments. However, the present invention is not limited to the embodiments described above and can be modified in various manners without departing from the gist of the invention.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   first to n-th (n is an integer equal to or greater than 2) memories;
   a controller that designates addresses of the n number of memories;
   a multi-layer wiring board having lines formed thereon, the lines connecting the controller with the memories; and
   a solder ball group including a plurality of solder balls arranged in an array, and connecting the controller with the lines of the multi-layer wiring board, wherein
   a plurality of address lines formed on the multi-layer wiring board includes a plurality of first address lines formed of a first wiring layer of the multi-layer wiring board,
   the plurality of address lines formed on the multi-layer wiring board includes a plurality of second address lines formed of a second wiring layer of the multi-layer wiring board, the first wiring layer being at a different level from the second wiring layer, and
   in each of the first and second wiring layers, each of the first and second address lines from the solder balls of the solder ball group is routed in order from the first memory to the n-th memory,
   wherein in the solder ball group, all of solder balls connected to the first address lines are arranged on an outer peripheral side of the controller relative to all of solder balls connected to the second address lines in planar view.

2. The semiconductor device according to claim 1, wherein the first wiring layer is formed on a mounting surface of each of the solder balls.

3. The semiconductor device according to claim 2, wherein a first data line group formed of the first wiring layer and a second data line group formed of the second wiring layer are formed on the multi-layer wiring board.

4. The semiconductor device according to claim 3, wherein in the solder ball group, all of solder balls connected to the first data line group are arranged on an outer peripheral side of the controller relative to all of solder balls connected to the second data line group, in planar view.

5. The semiconductor device according to claim 3, wherein some memories of the n number of memories transmit and receive data to and from the controller through the first data line group, and other memories of the n number of memories transmit and receive data to and from the controller through the second data line group.

6. The semiconductor device according to claim 5, wherein memories connected to the first data line group and memories connected to the second data line group are alternately arranged.

7. The semiconductor device according to claim 6, wherein in the solder ball group, all of solder balls connected to the first data line group are arranged on an outer peripheral side of the controller relative to all of solder balls connected to the second data line group, in planar view.

8. The semiconductor device according to claim 7, wherein the first to n-th memories are arranged in a staggered manner such that a distance between each memory connected to the first data line group and the controller is longer than a distance between each memory connected to the second data line group and the controller.

9. A semiconductor device comprising:
   first to n-th (n is an integer equal to or greater than 2) memories;
   a controller that designates addresses of the n number of memories;
   a multi-layer wiring board having lines formed thereon, the lines connecting the controller with the memories; and
   a solder ball group including a plurality of solder balls arranged in an array, and connecting the controller with the lines of the multi-layer wiring board, wherein
   a plurality of address lines formed on the multi-layer wiring board includes a plurality of first address lines formed of a first wiring layer of the multi-layer wiring board,
   the plurality of address lines formed on the multi-layer wiring board includes a plurality of second address lines formed of a second wiring layer of the multi-layer wiring board, the first wiring layer being at a different level from the second wiring layer, and
   in each of the first and second wiring layers, each of the first and second address lines from the solder balls of the solder ball group is routed in order from the first memory to the n-th memory,
   wherein a first data line group formed of the first wiring layer and a second data line group formed of the second wiring layer are formed on the multi-layer wiring board,
   wherein the first to n-th memories are arranged in a staggered manner such that a distance between each memory connected to the first data line group and the controller is longer than a distance between each memory connected to the second data line group and the controller.

* * * * *